United States Patent [19]
Leedy

[11] Patent Number: 5,323,035
[45] Date of Patent: Jun. 21, 1994

[54] INTERCONNECTION STRUCTURE FOR INTEGRATED CIRCUITS AND METHOD FOR MAKING SAME

[76] Inventor: Glenn Leedy, 1061 E. Mountain Dr., Santa Barbara, Calif. 93108

[21] Appl. No.: 960,588

[22] Filed: Oct. 13, 1992

[51] Int. Cl.$^5$ .............. H01L 23/48; H01L 29/46; H01L 29/62; H01L 29/64
[52] U.S. Cl. .............. 257/248; 257/784
[58] Field of Search .......... 257/750, 751, 753, 748, 257/779, 780, 781, 784

[56] References Cited

U.S. PATENT DOCUMENTS

| | | | |
|---|---|---|---|
| 4,862,243 | 8/1989 | Welch et al. | 257/751 |
| 5,048,744 | 9/1991 | Chang et al. | 257/779 |
| 5,177,439 | 1/1993 | Liu et al. | 324/158 P |

Primary Examiner—Rolf Hille
Assistant Examiner—S. V. Clark
Attorney, Agent, or Firm—Blakely, Sokoloff, Taylor & Zafman

[57] ABSTRACT

A device for making temporary or permanent electrical connections to circuit pads of an integrated circuit is made with conventional semiconductor fabrication processes. The device has a supporting substrate from which project a plurality of insertion structures that are in mating alignment with corresponding circuit pads of the integrated circuit. Each insertion structure is metallized to make electrical contact with the corresponding circuit pad. The electrical contacts may be temporary or permanent depending upon the choice of metallization and the pressure applied to the contacting surfaces. The insertion structure devices have particular application for functional testing, electrical burn-in and packaging of an integrated circuit either as a full wafer or as an individual die.

9 Claims, 7 Drawing Sheets

Fig_1a

Fig_1b

*Fig_1c*

*Fig_2*

Fig_3

Fig_4a

Fig_4b

Fig_5a

Fig_5b

Fig_6

Fig_7

Fig_8

INTERCONNECTION STRUCTURE FOR INTEGRATED CIRCUITS AND METHOD FOR MAKING SAME

SUMMARY OF THE INVENTION

Functional testing, electrical burn-in and packaging of integrated circuits (ICs) have become ever increasingly important aspects of the IC manufacturing process since each of these imposes limitations on the practical complexity of ICs and significantly impacts the cost of electronic goods made with ICs. The present invention reduces the costs associated with present methods of functional testing, burn-in and packaging of ICs by integrating into the highly cost efficient IC fabrication process a novel interconnection device that reduces the complexity and increases the capability of IC functional testing, burn-in and packaging.

The present invention provides a low cost means for making precision placement of electrical interconnections to metal signal, power and ground contacts of arbitrary size on the surface of an IC die through no more than the two steps of physical alignment and the application of a mechanical loading force. Rigid or flexible substrates fabricated with a plurality of insertion structures can be used to make temporary and reliable electrical interconnection to the signal, power and ground contacts of an IC for the purpose of functional testing of all or a portion of an IC, or for the purpose of extended testing often referred to as burn-in. Permanent interconnect IC bonds can be formed with the insertion structure for the purpose of IC packaging.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods, devices and circuits are omitted so as to not obscure the description of the present invention with unnecessary detail.

Basic Insertion Structure

Figure 1A:
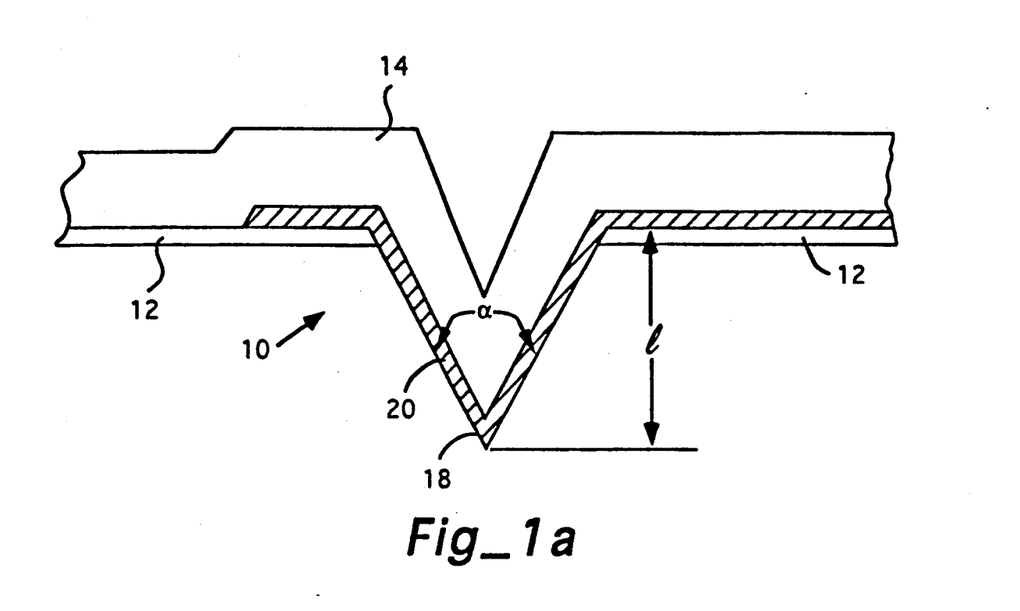
FIG. 1a is a cross-sectional view of an insertion structure fabricated in accordance with the present invention.

Referring first to FIG. 1a, a basic insertion structure 10 constructed in accordance with the present invention is shown in cross section. Insertion structure 10 has a generally pyramidal shape with opposite sidewalls inclined at an included angle α. A conductive layer 20 is deposited or otherwise formed on the surface of insertion structure 10. As more fully described below, established semiconductor and micro-machining processing techniques and methods are used to form the insertion structure 10 and conductive layer 20.

Using conventional semiconductor processes, insertion structure 10 can be made with geometries from greater than 100 μm in extended length 1 and 250 μm in maximum diameter feature size to less than 1 μm in extended length and 0.5 μm in maximum diameter feature size. The geometry of the insertion structure is limited only by the capability of available semiconductor processing equipment. The continuing enhancement of semiconductor processing equipment can be expected to permit the fabrication of insertion structures with minimum feature sizes of less than 100 nm.

Figure 1B:
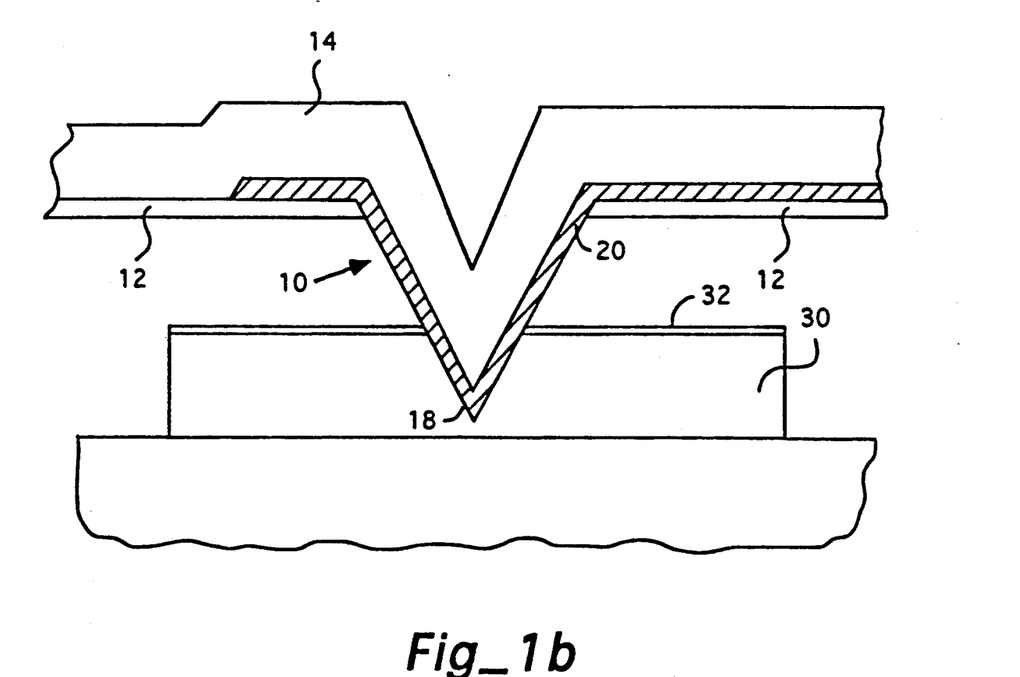
FIG. 1b is a cross-sectional view of the insertion structure of FIG. 1a in temporary electrical contact with an integrated circuit pad.

Referring now to FIG. 1b, insertion structure 10 is shown in contact with a metal pad 30 such as a bonding pad of an IC. When pressed into the pad 30 by an applied force, the insertion structure 10 penetrates (indents) the surface of the metal pad, including any native oxide 32 formed on the metal surface, and establishes a low resistance electrical contact. The low resistance of the contact results from the penetration of any native oxide or other surface contamination by the insertion structure, and the deformation of the metal pad, thereby increasing surface contact with the insertion structure.

The pointed tip 18 of insertion structure 10 with its conductive layer 20 penetrates a prescribed distance into the metal pad 30. The depth of penetration is determined primarily by the applied load force and the included angle α of the tip of the insertion structure. In addition, the choice of material for the conductive layer 20 on the insertion structure, the value of the included angle α of the insertion structure and the magnitude of the load force are all factors which determine whether the connection between insertion structure 10 and metal pad 30 is temporary or permanent. As an example, an insertion structure coated with approximately 2,000 Å of aluminum, with an included angle of 70° and load force of approximately 1 gm will penetrate an aluminum contact pad to a depth of approximately 5,000 Å and form a permanent bond (metal diffusion bond). In contrast, a copper or iridium coated insertion structure under similar conditions will not form a permanent bond, but will maintain a temporary low resistance electrical contact as long as the load force is applied.

A critical aspect of the present invention is fabrication control of the extended length 1 of the insertion structures. The extended length of the insertion structure is measured from the surface of the original substrate in which it is formed. The points or ends of the insertion structures typically penetrate less than 1 μm into the surface of the metallized circuit pad with which the insertion structure is intended to make contact. In the typical case of a substrate having a plurality of insertion structures for contact with a corresponding plurality of IC pads, the variation in the extended length of the insertion structures should be less that 50-75% of the desired penetration depth, although greater variation may be acceptable with the use of a thin flexible (membrane) substrate. Flatness variations of the surface of the original substrate over an area of several square centimeters are estimated to be less than 100 Å for prime quality silicon wafers. The variation of controlled etch into the substrate is typically less than 0.5% of the extended length of the insertion structures with aspect ratios of 4:1 or less for insertion structures placed over an area of several square centimeters.

Figure 1C:
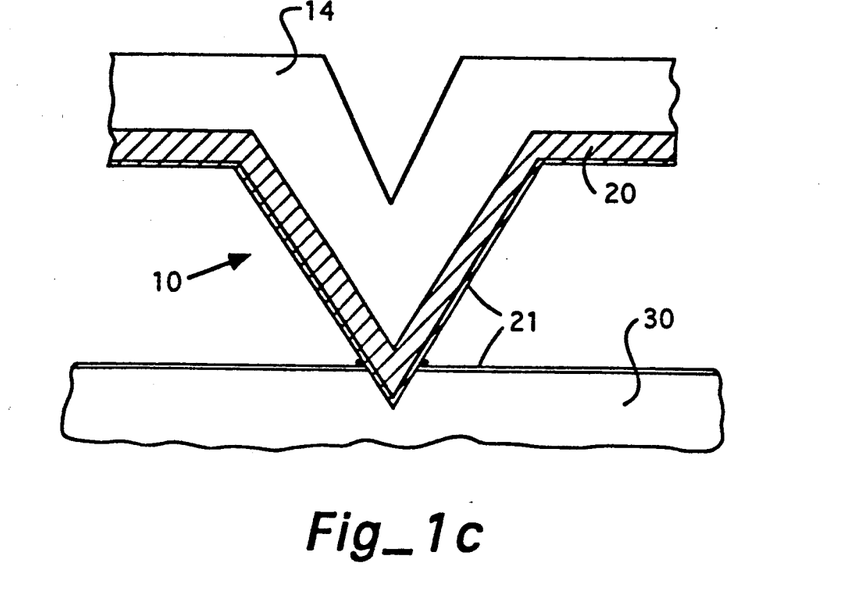
FIG. 1c is a cross-sectional view of an insertion structure according to the present invention in permanent electrical contact with an integrated circuit pad.

A variety of metal films may be used to form the conductive layer on the insertion structure. Some examples are aluminum, copper, iridium or multiple layer films such as iridium:copper, tin-lead:copper or indium:aluminum. The use of tin-lead, indium, indium alloys or other lower melting point metal solders or metal alloys enable permanent bonds to be subsequently debonded with the application of a temperature above the melting point of the metal alloy. The use of a metal conducting layer on the insertion structure that is the same as that used to form the metal contact pad on the IC will allow a permanent metal diffusion bond to occur under appropriately selected loading force and included angle of the insertion structure. FIG. 1c illustrates such a permanent bond where, for example, a tin-lead film 21 is applied over insertion structure 10 as well as IC pad 30. The use of dissimilar metals such as iridium, rhodium or copper metals in forming the insertion structure versus an aluminum contact pad on the IC will generally result in a temporary low resistance contact that may be maintained for as long as the appropriate loading force is applied.

Fabrication Methods

The insertion structures of the present invention are formed by etching the desired pattern of projecting structures into a sacrificial substrate. Single crystal silicon with a <100> crystal orientation is the preferred material for the substrate. However, the present invention is not limited to this particular crystal orientation or to the use of silicon as a substrate. Materials such as gallium arsenide, indium phosphide or diamond can also be used. The primary requirements that the sacrificial substrate must meet are: (i) it can be etched to form the desired insertion structure shapes; (ii) it can be polished to a sufficient flatness tolerance; (iii) it can withstand subsequent processing steps; and (iv) it can be selectively etch removed uniformly in part or whole.

Referring again to FIGS. 1a and 1b, a mask layer 12 is first deposited on the substrate (not shown). In preferred embodiments of the present invention, mask layer 12 is a dielectric such as silicon dioxide or silicon nitride deposited with a depth of approximately 1000 Å to 2500 Å and a tensile stress of approximately $1 \times 10^8$ dynes/cm$^2$. A process for making such a deposition is disclosed in this inventor's co-pending application Ser. No. 07/865,412 filed Apr. 8, 1992, the specification of which is incorporated herein by reference. Thicker layers of dielectric in excess of 2500 Å are best formed with silicon dioxide alone or in combination of two materials such as, for example, 1000 Å of nitride, 4 μm of oxide and another 1000 Å of nitride.

Since the primary function of this dielectric is to act as a mask for etching the underlying substrate, other appropriate mask materials could also be used in lieu of the preferred dielectric materials. Layer 12 is then etched to the underlying substrate with a pattern of windows defining the locations of the insertion structures. The substrate is then etched to create wells for the insertion structures.

The shape of each window defines the cross-sectional shape of the resulting insertion structure, whereas the etching process used determines the inclination of the side walls. For example, a square window with typical wet etch processing will produce a pyramidal insertion structure with a square cross-section. A rectangular window will produce an elongated prismatic insertion structure with a blade-like edge rather than a pointed tip (see FIG. 8). Circular, oval or other shaped windows may likewise be employed to produce insertion structures of nearly any desired shape (see FIG. 9).

Etch processing of the insertion structures can be accomplished by wet or dry etching techniques or a combination of both. Wet etch processing of silicon is performed typically with potassium hydroxide (KOH) or tetra methyl ammonia hydroxide (TMAH) to achieve anisotropic etching profiles in a <100> single crystalline silicon substrate. Etching with KOH or TMAH produces an insertion structure with an included angle of approximately 70°. Dry etch processing may be used to produce larger or smaller included angles in forming the desired shape of the insertion structures. Dry etch processing can be used to fabricate insertion structures of widely varying form as discussed below.

After the insertion structure shape has been etched into the substrate, conductive layer 20 is deposited using, for example, aluminum, iridium-copper, or SnPb-Cu. The thickness of the deposited metal is selected by the electrical contact result desired and the structural requirements of the contact to be made; e.g. a thicker deposition of metal is required if a subsequent layer of dielectric material is not deposited, or the hardness of the initial deposited metal layer may require the deposition of a second metal layer of appropriate hardness and/or a dielectric layer. Deposited metal film thickness will typically vary between 1,000 Å and 4 μm. The metal deposition is patterned in accordance with the individual insertion structures. Optionally, additional dielectric and metal films can be deposited and patterned to interconnect the insertion structures with one another and/or with other circuit elements. Care is taken to isolate the metal insertion structure from contact with remaining portions of the semiconductor substrate as shown, for example, in FIGS. 2 and 8.

Following deposition of conductive layer 20 and any additional metal/dielectric circuit layers, a structural layer 14 of dielectric material is preferably deposited to enhance durability of tip 18 and to achieve a desired electric signal impedance characteristic between adjacent insertion structures or circuit elements. The thickness and stress characteristics of structural layer 14 (and all other dielectric layers) are selected as appropriate for subsequent use of the insertion structures on a flexible, membrane or thinned substrate. Such structural inorganic materials as diamond, polysilicon, silicon carbide, silicon nitride, aluminum nitride, or organic polymeric materials such as polyimides or parylene may be deposited. As mentioned previously, the preferred materials are silicon dioxide and silicone nitride deposited with a tensile stress of approximately $1 \times 10^8$ dynes/cm$^2$.

Figure 2:
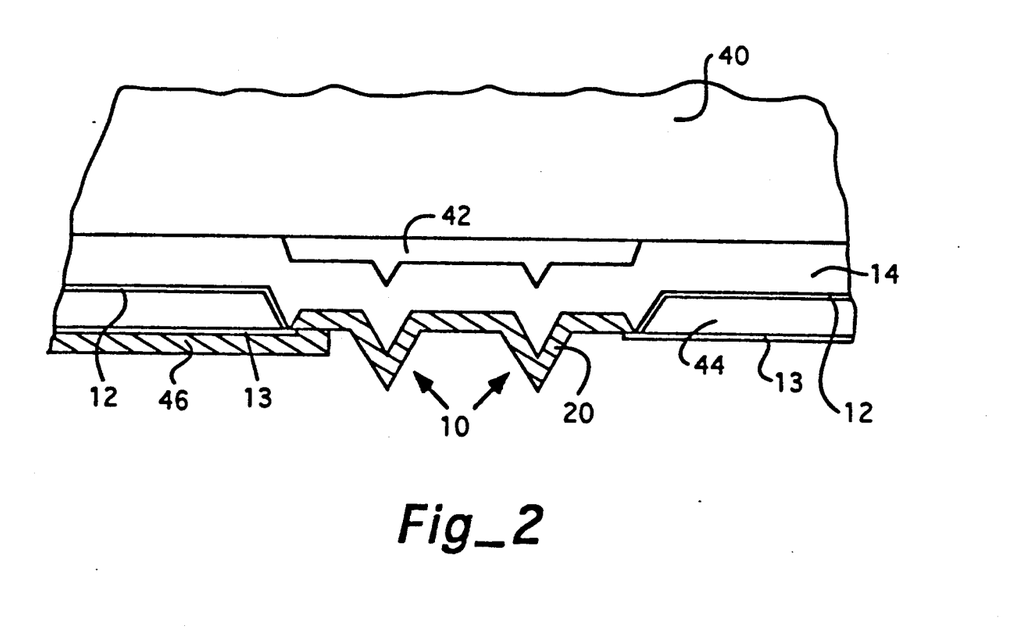
FIG. 2 is a cross-sectional view of a contact device with plural insertion structures.

Flexible, membrane of thinned substrates typically vary in thickness from 1000 Å to 10 μm or more depending on the desired use. Optionally, the surface of the substrate with the insertion structures may be bonded to a second rigid substrate or backing substrate. This bonding process can be accomplished for example by metal diffusion, or SiO$_2$ anodic bonding techniques. The original substrate in which the insertion structures were formed is subsequently partially or completely removed (as shown in FIGS. 2 and 1a, respectively) by a highly uniform and selective process of etching or a combination of grinding and selective etching. This leaves the insertion structures exposed to some portion of their extended length.

The side of the flexible or rigid substrate with the exposed insertion structures may be subjected to additional processing steps. These processing steps may include additional metallization interconnect and dielectric films and a passivation film. This provides the capability for fabrication of additional interconnect metallization structures on the backside of an IC, such as 46 shown in FIG. 2.

Exemplary Embodiments

The basic insertion structure described above has numerous variations and applications for testing, burn-in and packaging of ICs, some of which are described below with reference to FIGS. 2-9.

FIG. 2 illustrates a contact composed of two insertion structures 10 so as to maximize the contact surface area with a single metal contact or bonding pad of an IC. The insertion structures are supported by a rigid backing substrate 40 bonded to dielectric layer 14. Planarizing dielectric 42 is deposited within depressions in layer 14 above the insertion structures to provide a flat bonding surface. One or more additional metallization layers 46 may be deposited to provide circuit connections to the conducting layer 20.

Figure 3:
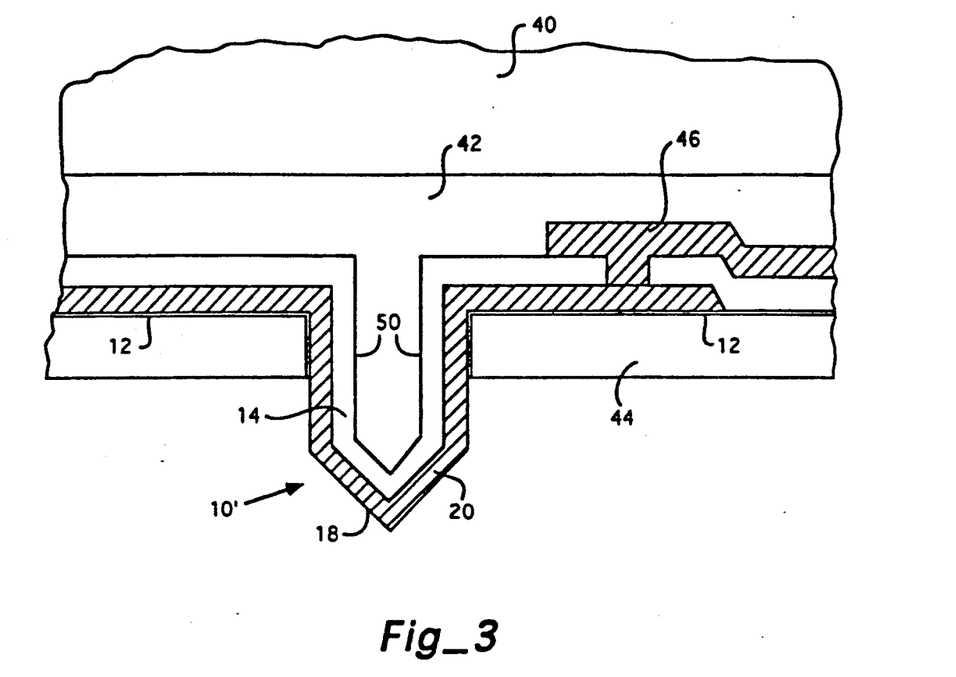
FIG. 3 is a cross-sectional view of an integrated circuit device with an integral insertion structure.

In FIGS. 2 and 3, a portion of the sacrificial substrate 44 remains below dielectric film 12 which can be utilized for fabrication of an integrated circuit integral with the insertion structures. The remaining portion of the substrate is a circuit device grade epitaxial layer formed over a germanium-boron (GeB) doped epitaxial layer, or other etch stop means such as an implanted layer of silicon dioxide or silicon nitride, which is used as a highly uniform (selective) etch stop in removing the original silicon substrate. GeB doped to a concentration of approximately $2 \times 10^{20}$ boron atoms/cm$^3$ provides a particularly effective etch stop for KOH or TMAH, having a selectivity over silicon in the range of approximately 1000-5000:1 depending on the exact doping concentration. The germanium co-doping of approximately 1½% provides stress relief in the epitaxial film. The GeB epitaxial etch stop layer is typically less than 1.5 μm in thickness. The GeB etch stop layer is (optionally) subsequently removed to expose the circuit device grade epitaxial layer for additional IC fabrication steps. Note that in FIG. 2 an additional dielectric film 13 is deposited over the exposed surface of the epitaxial layer 44. This serves, in part, to provide insulation for metallization layer 46.

Figure 7:
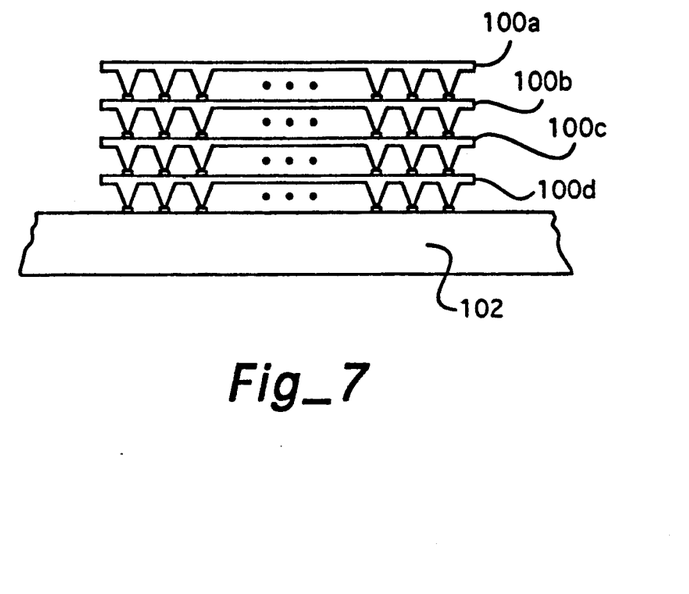
FIG. 7 illustrates the fabrication of a three-dimensional integrated circuit structure according to the present invention.

Integrated circuit devices can optionally be fabricated in the circuit device grade epitaxial layer prior to the formation of the insertion structures. This circuit device grade epitaxial layer formed in the manner described above allows ICs to be fabricated with insertion structures integral to the substrate of the IC (die) and that extend from the bottom of the thinned semiconductor substrate (epitaxial layer). Such devices are described below in connection with FIGS. 5b and 7. Integral insertion structures simplify the mechanical handling in testing, burn-in and packaging of the IC to a two step process consisting of physical alignment and the application of a loading force. ICs with an integral insertion structure also allows three-dimensional IC structures to be assembled as shown in FIG. 7.

FIG. 3 further illustrates an insertion structure 10' that is shaped generally like an obelisk which may be formed by a combination of dry and wet etching. The nearly vertical walls 50 of insertion structure 10' are formed by first dry etching the substrate 44. Walls 50 are then passivated prior to wet etching tip portion 18 as described above.

Figure 4A:
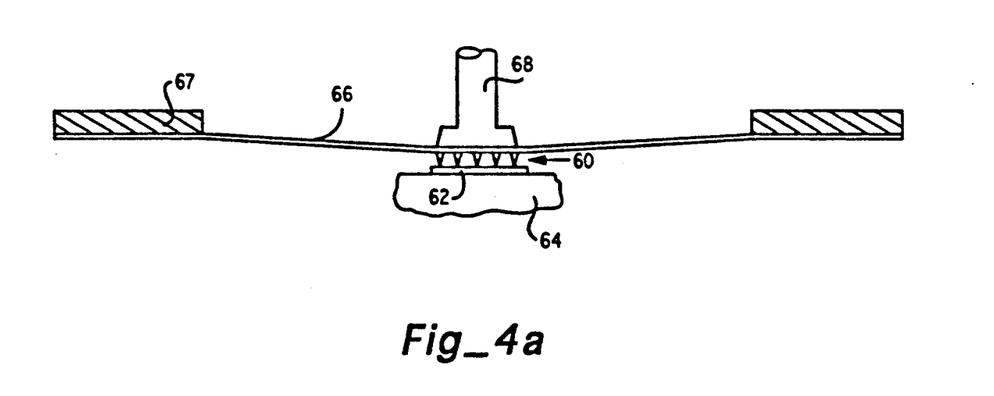
FIG. 4a illustrates a circuit probe according to the present invention for use in functional testing or electrical burn-in of an integrated circuit.

FIG. 4a illustrates an insertion structure device 60 used as a circuit probe for integrated circuit 62 during functional circuit testing or electrical burn-in. Integrated circuit 62, which may still be in wafer form, is supported on a holding fixture 64. Device 60 is formed on a thin flexible membrane 66, supported at its perimeter by retaining ring 67. Circuit 62 is brought into alignment with device 60 in the horizontal plane such that the insertion structures of device 60 are disposed above the corresponding contact pads of the circuit. A suitable force application means 68 is applied to the back side of flexible membrane 66 so that the insertion structures of device 60 make electrical contact with the corresponding circuit pads. A mechanical means for applying force is represented in FIG. 4a; however, any other means, such as pressurized fluid, could also be used. Typically, a loading force of less than 5 gms per insertion structure is sufficient to establish a reliable contact.

Burn-in of circuit devices typically requires many hours of testing under stressing temperature and electrical conditions. A die that passes this testing is subsequently packaged in some manner, so it is important that the electrical contact made to the contact pad of the die during burn-in be temporary with minimal or no visible damage to the pad of the die. The benefits of a burn-in fixture made in accordance with the present invention are the ability to process the die while in wafer form, to do so without damage to the pads of the die, to test the die at or near the full speed operating speed of the circuit (owing to the IC fabrication method of the membrane), all at a low cost in capital equipment fixturing.

Figure 4B:
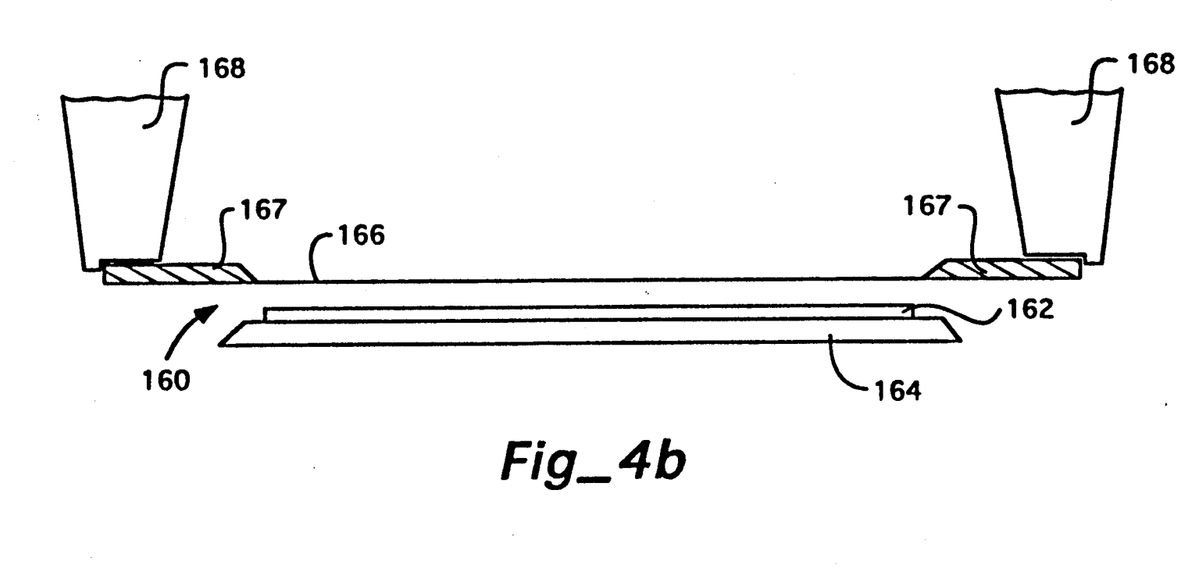
FIG. 4b is a cross-sectional view of a circuit probe for use in functional testing or electrical burn-in of a full wafer IC.

FIG. 4b illustrates an insertion structure device 160 that is particularly adapted for functional testing and/or electrical burn-in of a full wafer fabricated semiconductor 162. Wafer 162 is supported by a fixture or wafer chuck 164. Device 160 is formed on a membrane 166 and includes a set of insertion structures for each integrated circuit die on wafer 162 that is to undergo testing and/or burn-in. Insertion structures corresponding to the contact pads of each die are approximately coupled to signal, power and ground traces formed in layers of metallization deposited on and through membrane 166.

These traces terminate at connectors at the periphery of membrane 166 where it is supported by ring 167. The peripheral connectors are electrically coupled by conventional means to test electronics such that each die of wafer 162 can be individually powered, accessed and tested. Device 160 is held in tooling 168 which is mechanically aligned with wafer chuck 164. The insertion structures of device 160 are brought into contact with mating pad on wafer 162 by suitable force application means (not shown).

Figure 5A:
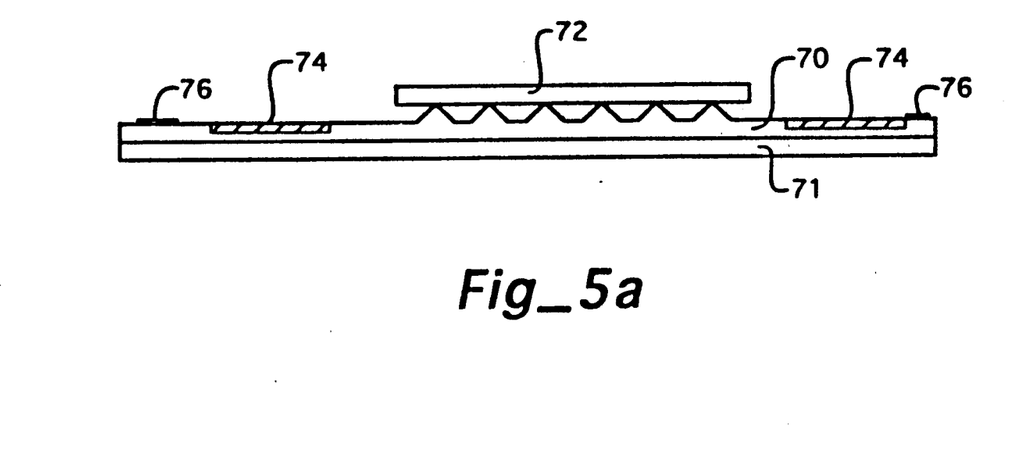
FIG. 5a is a cross-sectional view of an alternative circuit probe fixture.

FIG. 5a illustrates an insertion structure device 70 with a rigid backing substrate 71 used as a circuit testing or burn-in fixture for integrated circuit 72. Contact pads of circuit 72 are aligned with mating insertion structures of device 70 and a sufficient force is applied (by means not shown) to establish electrical contact without forming permanent bonds. Device 70 preferably includes integral circuitry 74 to control its operation and to provide electrical communication between the insertion structures and bonding pads 76 disposed at the periphery of device 70.

Figure 5B:
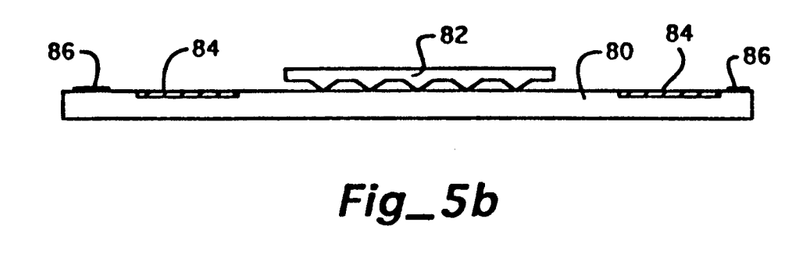
FIG. 5b is a cross-sectional view of an integrated circuit with integral insertion structures in combination with a mating test fixture.

FIG. 5b illustrates a circuit testing or burn-in fixture 80 similar to that shown in FIG. 5a; however, in this case, circuit 82 is fabricated with integral insertion structures and mating contact pads are fabricated on the surface of fixture device 80. As in the previous example, integral circuitry 84 is preferably fabricated directly on device 80.

Figure 6:
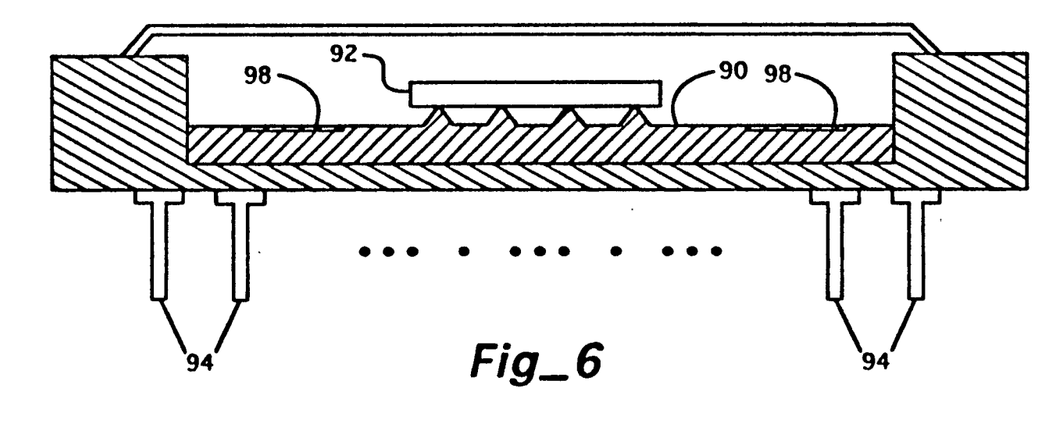
FIG. 6 is a cross-section view of a device for mounting and packaging an integrated circuit according to the present invention.

FIG. 6 illustrates an insertion structure device 90 used as a permanent mounting structure for integrated circuit 92. In this case, permanent metallic bonds are formed, for example in the manner illustrated in FIG. 1c, between the insertion structures of device 90 and the corresponding pads of circuit 92. The insertion structures are electrically connected to the pins 94 of package 96 by means of (active or passive) integral circuitry 98 formed directly on device 90. It will be recognized that a similar packaging solution may be achieved using a circuit having integral insertion structures and a substrate having mating contact pads in a manner analogous to that shown in FIG. 5b.

FIG. 7 illustrates a three-dimensional integrated circuit fabricated with the techniques of this invention. Each of circuit devices 100a–100d is fabricated with an array of integral insertion structures on one surface and with an array of contact pads on the opposite surface. The array of contact pads on each device corresponds to the array of insertion structures on the device stacked above, and the devices are permanently bonded to one another. The stack of devices is supported on a substrate 102 which may be packaged in the manner illustrated in FIG. 6. It will be recognized that this technique is capable of achieving an extremely high circuit density within a single package.

Figure 8:
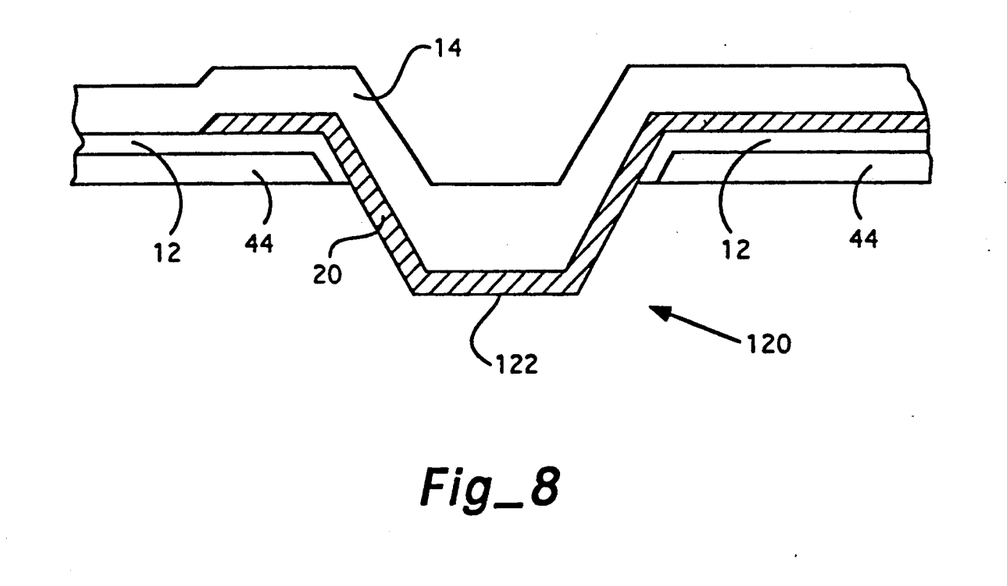
FIG. 8 is a cross-sectional view of an insertion structure with an elongated blade tip.

FIG. 8 illustrates an insertion structure 120 formed in the same manner as structure 10 of FIG. 1a but using a rectangular etching window to produce an elongated insertion structure with a blade-like edge 122. The length of edge 122 is not restricted, but would typically be less than approximately 2 mils (50 μm).

Figure 9:
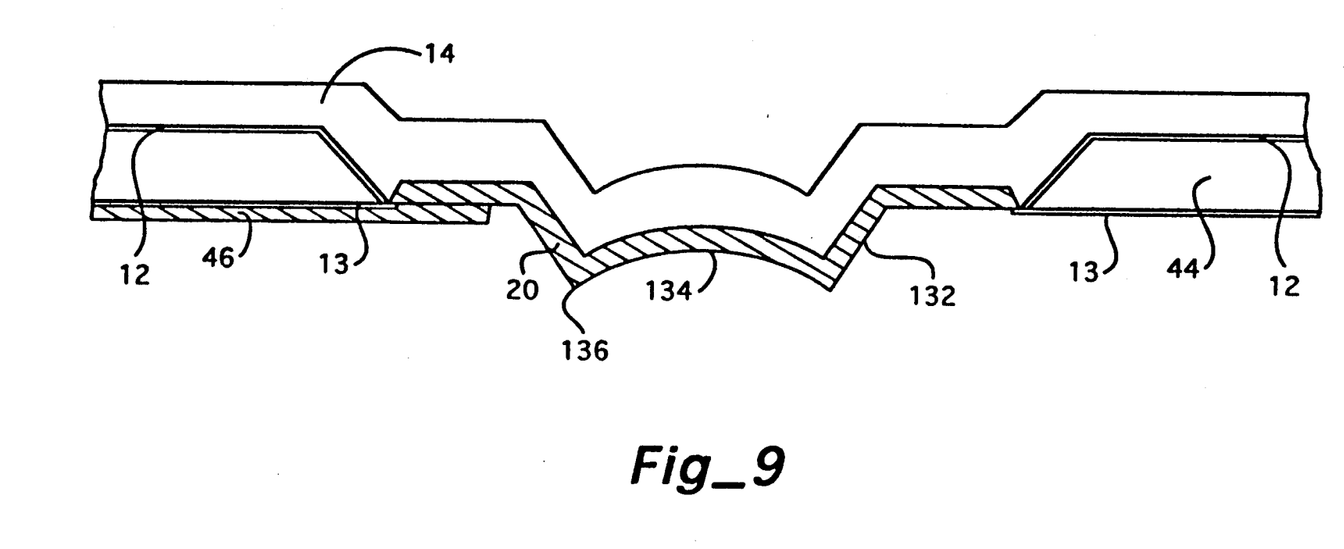
FIG. 9 is a cross-sectional view of an insertion structure with a concave tip.

FIG. 9 illustrates yet another form of insertion structure 130. In this case, a circular etching window is used to provide a circular cross-section. Alternatively, an oval window could be used to provide a corresponding oval cross-section. A controlled dry etch process is used to form inclined (conical) side walls 132 and a concave tip portion 134. Insertion structure 130 thus has a piercing or cutting edge 136 around the entire periphery of tip portion 134. The concave shape of the tip is a result of the dry etch process control. This form of insertion structure increases the metal-to-metal contact area that the insertion structure has with the circuit pad to be controlled.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

I claim:

1. A device for making electrical contact with a separate integrated circuit having at least one metallized circuit pad, said device comprising:
   (a) a supporting substrate;
   (b) at least one pad insertion structure supported by the substrate and projecting therefrom for penetrating a surface of said metallized circuit pad and establishing electronical contact therewith, said pad insertion structure having a base portion proximal to the substrate and a tip portion at a distal end of the pad insertion structure for contacting said circuit pad;
   (c) a layer of conductive material disposed on the tip portion of the pad insertion structure;
   (d) conduction means coupled to the layer of conductive material for providing an electrically conductive path to the tip portion of the pad insertion structure.

2. The device of claim 1 wherein the side walls of the pad insertion structure comprise a layer of dielectric material.

3. The device of claim 2 wherein the dielectric material is selected from the group consisting of silicon nitride and silicon dioxide.

4. The device of claim 1 wherein a plurality of pad insertion structures are disposed on the supporting substrate in mating alignment with a corresponding plurality of circuit pads on the integrated circuit.

5. A device for electrically activating a separate integrated circuit having a plurality of metallized contact pads, said device comprising:
   (a) a supporting substrate;
   (b) a plurality of pad insertion structures supported by the substrate and projecting therefrom in mating alignment with corresponding ones of the plurality of contact pads on the integrated circuit, each of said pad insertion structures having a base portion proximal to the substrate, a tip portion at a distal end of the pad insertion structure for penetrating a surface of a corresponding one of the contact pads and establishing electrical contact therewith, and side walls tapering from the base portion toward the tip portion;
   (c) a layer of conductive material disposed on the tip portion of each of the pad insertion structures;
   (d) conduction means coupled to the layer of conductive material of each pad insertion structure for providing an electrically conductive path to the tip portion of the pad insertion structure;
   (e) force application means coupled to the supporting substrate for urging the plurality of pad insertion structures into intimate contact with the corresponding plurality of contact pads, thereby establishing electrical communication therewith.

6. The device of claim 5 wherein the integrated circuit comprises a full wafer having a plurality of integrated circuit dice and the device includes pad insertion structures for contacting each die of the full wafer.

7. A device for mounting an integrated circuit having a plurality of metallized contact pads, said device comprising:

(a) a supporting substrate;

(b) a plurality of pad insertion structures supported by the substrate and projecting therefrom in mating alignment with and bonded to corresponding ones of the plurality of contact pads on the integrated circuit, each of said pad insertion structures having a base portion proximal to the substrate, a tip portion at a distal end of the pad insertion structure penetrating into the corresponding contact pad, and side walls tapering from the base portion toward the tip portion;

(c) a layer of conductive material disposed on the tip portion of each of the pad insertion structures;

(d) conduction means coupled to the layer of conductive material of each pad insertion structure for providing an electrically conductive path to the tip portion of the pad insertion structure, thereby establishing electrical communication with the corresponding contact pad.

8. An integrated circuit device comprising:

(a) an integrated circuit formed on a semiconductor substrate having a plurality of apertures therethrough;

(b) a plurality of pad insertion structures disposed within respective ones of the plurality of apertures and projecting therefrom for penetrating a surface of a metallized contact pad of a separate circuit and establishing electrical contact therewith, each of said pad insertion structures having a base portion proximal to the substrate and a pointed tip portion at a distal end of the insertion structure;

(c) a layer of conductive material disposed on the tip portion of each of the pad insertion structures;

(d) conduction means coupled to the layer of conductive material of each insertion structure for providing an electrically conductive path between the tip portion of the pad insertion structure and a corresponding node of the integrated circuit.

9. An electronic device comprising a plurality of integrated circuit devices each of which has a first and second surface and comprises:

(a) an integrated circuit formed on a semiconductor substrate having a plurality of apertures therethrough;

(b) a plurality of pad insertion structures disposed within respective ones of the plurality of apertures and projecting from the first surface of the integrated circuit device for penetrating a surface of a metallized contact pad of a separate circuit and establishing electrical contact therewith, each of said pad insertion structures having a base portion proximal to the substrate and a pointed tip portion at a distal end of the insertion structure;

(c) a layer of conductive material disposed on the tip portion of each of the pad insertion structures;

(d) first conduction means coupled to the layer of conductive material of each pad insertion structure for providing an electrically conductive path between the tip portion of the pad insertion structure and a corresponding node of the integrated circuit;

(e) a plurality of contact pads disposed on the second surface of the integrated circuit device;

(f) second conduction means coupled to each of the contact pads for providing an electrically conductive path between the contact pad and a corresponding node of the integrated circuit;

wherein the plurality of integrated circuit devices are stacked with the tip portions of the pad insertion structures of one such integrated circuit device in mating contact with corresponding contact pads of an adjacent integrated circuit device.

* * * * *